(12) United States Patent
Gruening et al.

(10) Patent No.: US 6,229,173 B1
(45) Date of Patent: May 8, 2001

(54) HYBRID 5F2 CELL LAYOUT FOR BURIED SURFACE STRAP ALIGNED TO VERTICAL TRANSISTOR

(75) Inventors: Ulrike Gruening, Wappingers Falls; Carl J. Radens, LaGrangeville, both of NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/339,271

(22) Filed: Jun. 23, 1999

(51) Int. Cl.$^7$ ..................................................... H01L 29/72
(52) U.S. Cl. .......................... 257/301; 257/302; 438/246; 438/249
(58) Field of Search ..................................... 257/301, 302; 438/246, 249

(56) References Cited

U.S. PATENT DOCUMENTS

| | | |
|---|---|---|
| 4,673,962 | 6/1987 | Chatterjee et al. . |
| 5,034,787 | 7/1991 | Dhong et al. . |
| 5,102,817 | 4/1992 | Chatterjee et al. . |
| 5,160,987 | 11/1992 | Pricer et al. . |
| 5,336,629 | 8/1994 | Dhong et al. . |
| 5,360,758 | 11/1994 | Bronner et al. . |
| 5,384,277 | 1/1995 | Hsu et al. . |
| 5,389,559 | 2/1995 | Hsieh et al. . |
| 5,395,786 | 3/1995 | Hsu et al. . |
| 5,512,767 | 4/1996 | Noble, Jr. . |
| 5,521,115 | 5/1996 | Park et al. . |
| 5,545,583 | 8/1996 | Lam et al. . |
| 5,576,566 | 11/1996 | Kenney . |
| 5,627,092 | 5/1997 | Alsmeier et al. . |
| 5,658,816 | 8/1997 | Rajeevakumar . |
| 5,670,805 * | 9/1997 | Hammerl et al. ..................... 257/301 |

* cited by examiner

*Primary Examiner*—Edward Wojciechowicz
(74) *Attorney, Agent, or Firm*—McGinn & Gibb, PLLC; Daryl K. Neff, Esq

(57) ABSTRACT

A method and structure for an integrated circuit chip which includes forming a storage capacitor in a vertical opening in a horizontal substrate, forming a conductive strap laterally extending from the vertical opening and forming a transistor having a channel region extending along a vertical surface, the vertical surface lying outside of and being laterally displaced from the vertical opening, the transistor being electrically connected to the storage capacitor by an outdiffusion of the conductive strap.

20 Claims, 10 Drawing Sheets

HYBRID 5F2 CELL LAYOUT FOR BURIED SURFACE STRAP ALIGNED TO VERTICAL TRANSISTOR

BACKGROUND OF THE INVENTION

1. Field of the Invention

The present invention generally relates to semiconductor devices and more particularly to have a vertical transistor having a buried surface strap.

2. Description of the Related Art

Vertical transistors are known in the art of semiconductor manufacturing for reducing the overall size of the transistor device and, therefore, for allowing an increase in the scaling of such devices. However, conventional vertical transistors have substantial problems associated with the formation of the strap (e.g., the conductive connection between the storage device and the gate/drain of the transistor).

The invention overcomes these problems by forming a self-aligned buried strap within a vertical transistor, as specified below.

SUMMARY OF THE INVENTION

It is, therefore, an object of the present invention to provide a structure and method for manufacturing an integrated circuit chip which includes forming a storage capacitor in a vertical opening in a horizontal substrate forming a conductive strap laterally extending from the vertical opening and forming a transistor having a channel region extending along a vertical surface, the vertical surface lying outside of and being laterally displaced from the vertical opening, the transistor being electrically connected to the storage capacitor by an outdiffusion of the conductive strap.

The forming of the conductive strap includes removing an upper portion of an insulator surrounding the storage capacitor to form a strap gap and filling the strap gap with a conductive material. The forming of the transistor includes lithographically forming a gate opening in the substrate over the storage capacitor, the gate opening having at least one wall laterally displaced from the vertical opening, wherein the wall of the gate opening includes the vertical surface. The invention also includes forming first spacers in the gate opening and forming a strap opening in the substrate using the first spacers to align the strap opening, wherein the conductive strap is formed by forming second spacers in the strap opening. This process further includes removing the first spacers and a portion of the second spacers to form a step, the outdiffusion being formed in a portion of the step adjacent the conductive strap. The gate opening is wider than the strap opening, thereby forming the step.

The invention forms a gate conductor adjacent the vertical surface, wherein a voltage in the gate conductor makes the channel region conductive, electrically connecting the transistor and the storage capacitor via the conductive strap and the outdiffusion.

Another embodiment of the invention includes forming a storage capacitor in a vertical opening in a horizontal substrate, forming a step in the vertical opening above the storage capacitor, forming a conductive strap along a lower portion of the step, the conductive strap being electrically connected to the storage capacitor and laterally extending from the vertical opening, and forming a transistor having a channel region extending along a vertical portion of the step, the vertical surface lying outside of and being laterally displaced from the vertical opening, the transistor being electrically connected to the storage capacitor by an outdiffusion of the conductive strap.

The forming of the conductive strap includes removing an upper portion of an insulator surrounding the storage capacitor to form a strap gap and filling the strap gap with a conductive material. The forming of the transistor includes lithographically forming a gate opening in the substrate over the storage capacitor, the gate opening having at least one wall laterally displaced from the vertical opening, wherein the wall of the gate opening includes the vertical surface. The forming of the transistor further includes forming first spacers in the gate opening, and forming a strap opening in the substrate using the first spacers to align the strap opening and wherein the conductive strap is formed by forming second spacers in the strap opening. This process also includes removing the first spacers and a portion of the second spacers to form the step, the outdiffusion being formed in a portion of the step adjacent the second spacers.

The gate opening is wider than the strap opening, thereby forming the step. The manufacturing of the integrated circuit chip further includes forming a gate conductor adjacent the vertical surface, wherein a voltage in the gate conductor makes the channel region conductive, electrically connecting the transistor and the storage capacitor via the conductive strap and the outdiffusion.

An integrated circuit chip according to the invention includes a storage capacitor located in a vertical opening in a horizontal substrate, a transistor having a channel region extending along a vertical surface, the vertical surface lying outside of and being laterally displaced from the vertical opening, and a conductive strap laterally extending from the vertical opening, the conductive strap having an outdiffusion electrically connecting the transistor to the storage capacitor.

The integrated circuit chip further includes an insulator surrounding the storage capacitor and a strap gap in an upper portion of the insulator, the conductive strap being located in the strap gap. The vertical transistor includes a gate opening in the substrate over the storage capacitor, the gate opening having at least one wall laterally displaced from the vertical opening, wherein the wall of the gate opening includes the vertical surface. The integrated circuit chip further includes a strap opening in the substrate aligned with first spacers in the gate opening and second spacers in the strap opening, wherein a portion of the second spacers comprise the conductive strap. The invention further includes a step formed by a width difference in the gate opening and the strap opening, the outdiffusion being located in a portion of the step adjacent the conductive strap. The integrated circuit chip also includes a gate conductor adjacent the vertical surface, wherein a voltage in the gate conductor makes the channel region conductive, electrically connecting the transistor and the storage capacitor via the conductive strap and the outdiffusion.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF PREFERRED EMBODIMENTS OF THE INVENTION

Figure 1:
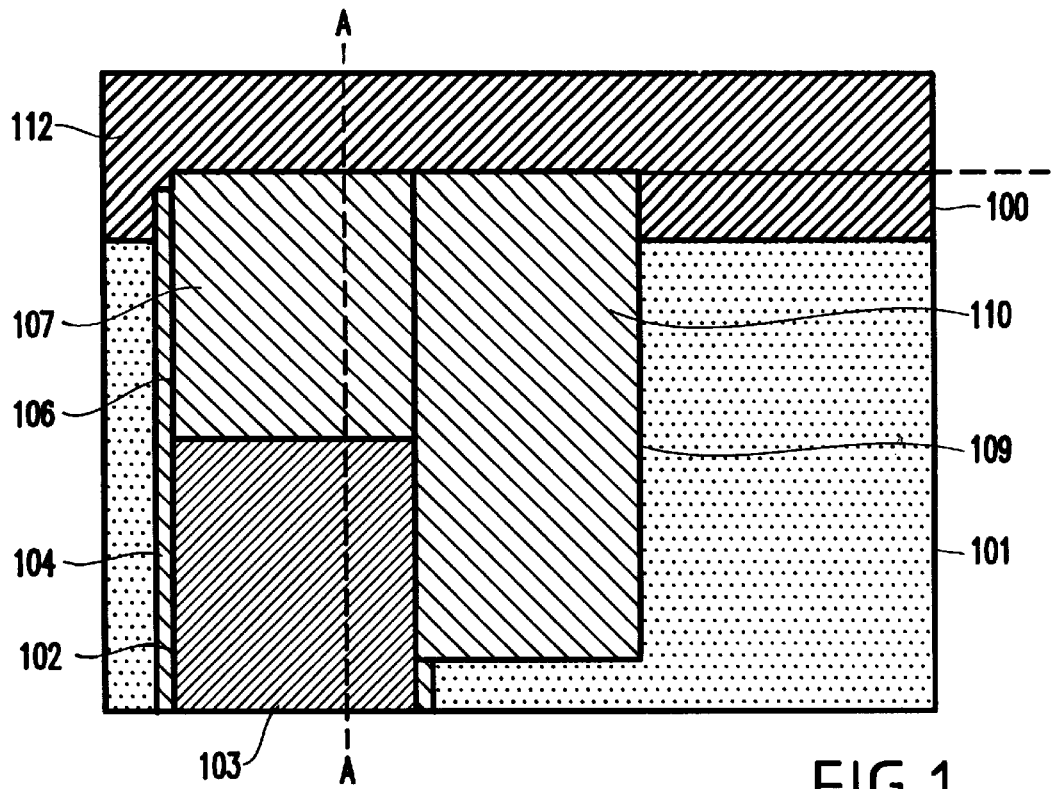
FIG. 1 is a schematic diagram of a partially completed vertical transistor according to the invention.
Figure 2:
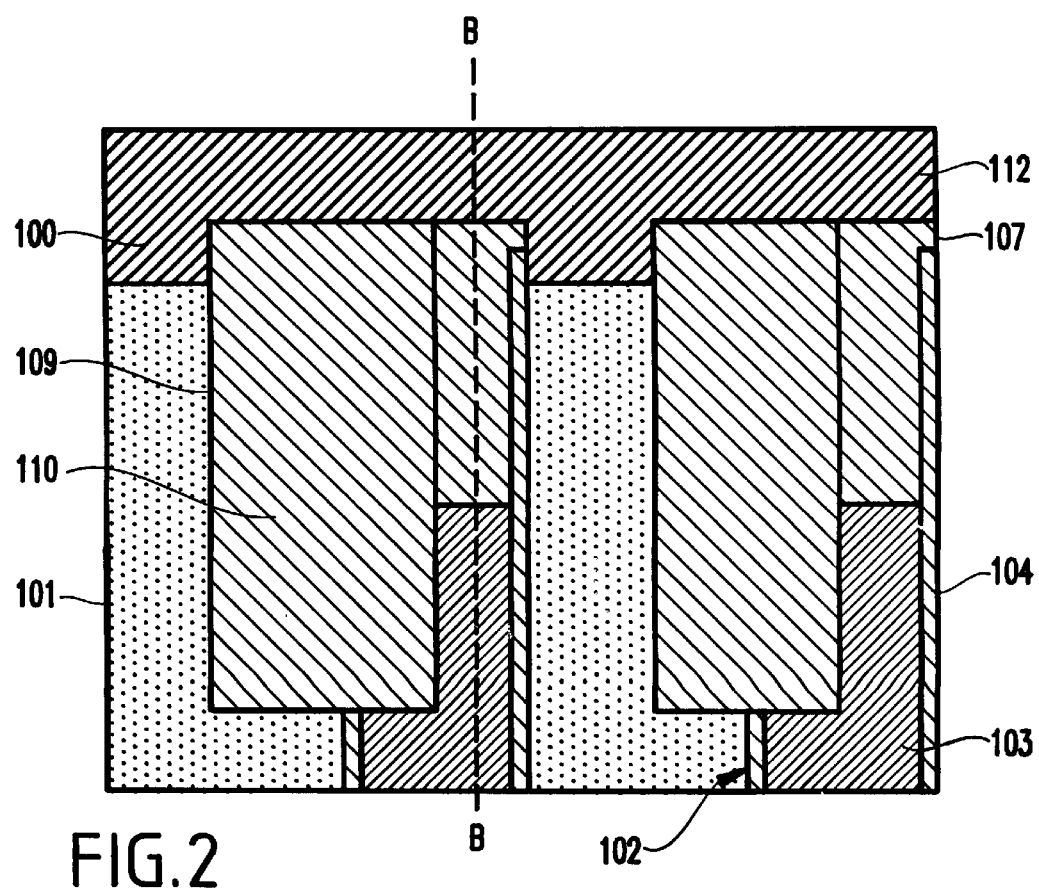
FIG. 2 is a schematic diagram of a partially completed vertical transistor according to the invention.

Referring now to the drawings, and more particularly to FIGS. 1–18, a first embodiment of the invention is illustrated. More specifically, FIG. 1 illustrates a front view and FIG. 2 illustrates a side view of the same structure. FIG. 1 is a cross-section along line B—B in FIG. 2 and FIG. 2 is a cross-section along line A—A in FIG. 1. The same items are given the same identification numbers throughout the drawings.

FIG. 1 illustrates a substrate 101, such as a silicon or other similar substrate. A pad layer 100, such as a pad nitride layer, is formed above the substrate 101 using conventional techniques, such as sputtering, evaporation, etc. The pad layer 100 is then planarized, again using conventional techniques, such as chemical mechanical polishing (CMP).

A deep trench for a storage capacitor 102 is formed in the substrate 101 using conventional lithographic masking and etching techniques. The trench 102 is lined with a thin insulator such as NO (oxynitride) to form the node dielectric. The upper portion of the trench is lined with an insulator 104, such as an oxide using well known processing, such as local oxidation of silicon (LOCOS). The thin insulator 104 is sometimes referred to herein as a "collar oxide" 104. Then, the trench 102 is filled with a conductive material 103, such as a metal, alloy or semiconductor, that will eventually form a storage capacitor. The conductive layer 103 is then partially recessed, using conventional methods, such as wet or dry etching.

The upper portion of the trench 106 is then filled with an insulator 107, again such as an oxide, to complete the storage capacitor. The insulator 107 is sometimes referred to herein as a trench top oxide 107. A trench 109 is then recessed into the substrate 101 to isolate adjacent devices from one another. This trench 109 is often referred to as an active area isolation trench. The trench is filled with an isolation material 110, such as liquid phase tetraethylorthosilicate (LPTEOS), or a high density plasma (HDP) oxide. The structure is then planarized using, for example, chemical mechanical polishing (CMP) and an upper pad layer 112 is deposited and planarized to cap the structure.

Figure 3:
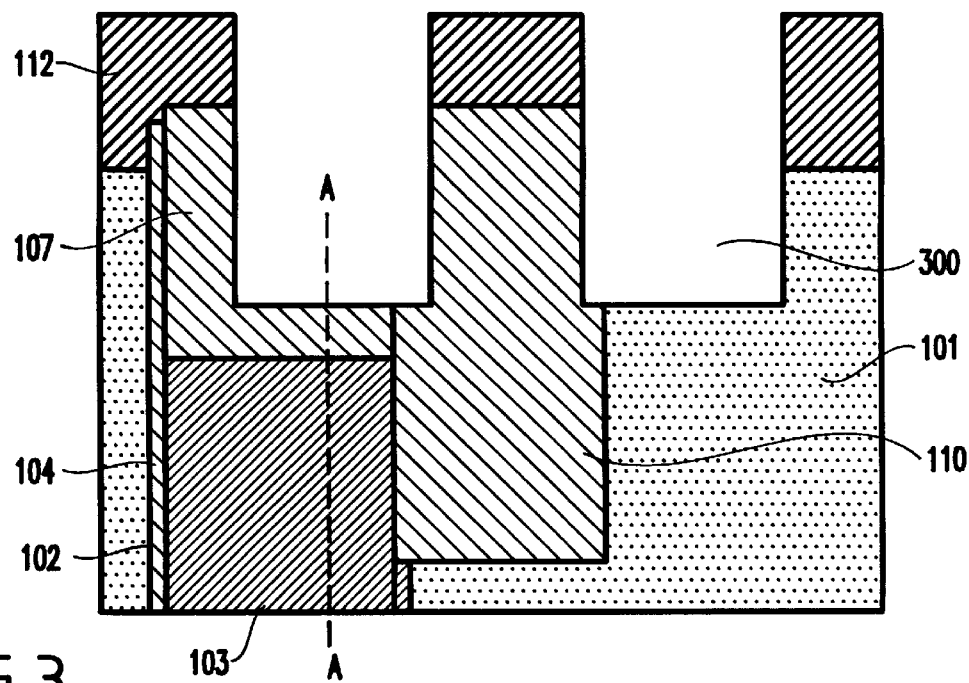
FIG. 3 is a schematic diagram of a partially completed vertical transistor according to the invention.

As with FIGS. 1 and 2, discussed above, FIGS. 3 and 4 respectively illustrate front and side views of the same structure. FIG. 3 is a cross-section along line B—B in FIG. 4 and FIG. 4 is a cross-section along line A—A in FIG. 3.

Figure 4:
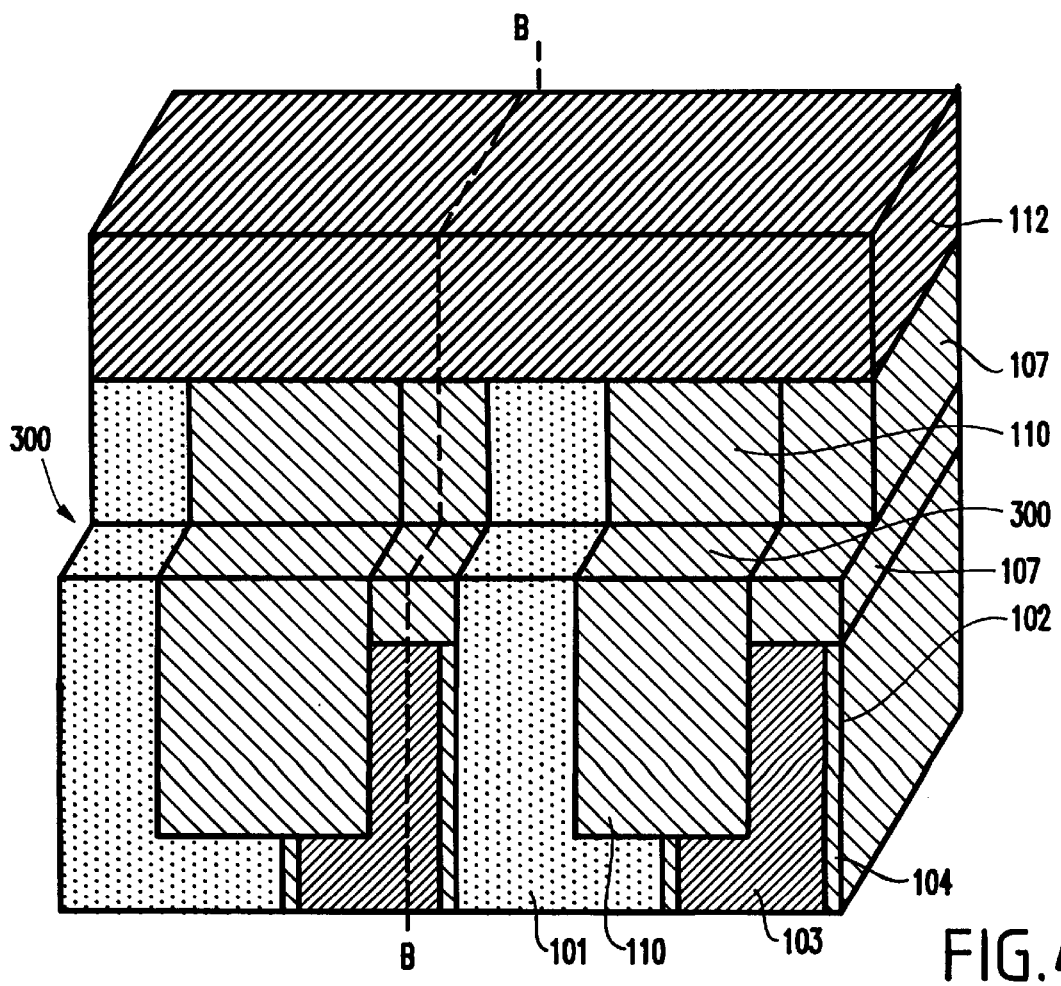
FIG. 4 is a schematic diagram of a partially completed vertical transistor according to the invention.

In FIGS. 3 and 4, the structure is subjected to further processing, including forming the trenches 300 (e.g., gate openings), shown in FIG. 3, using conventional processes, such as those discussed above. FIG. 4 is a perspective drawing and shows one-half of one of the trenches 300. The trenches will eventually be filled with a conductive material to form wordlines in the integrated circuit device.

Figure 5:
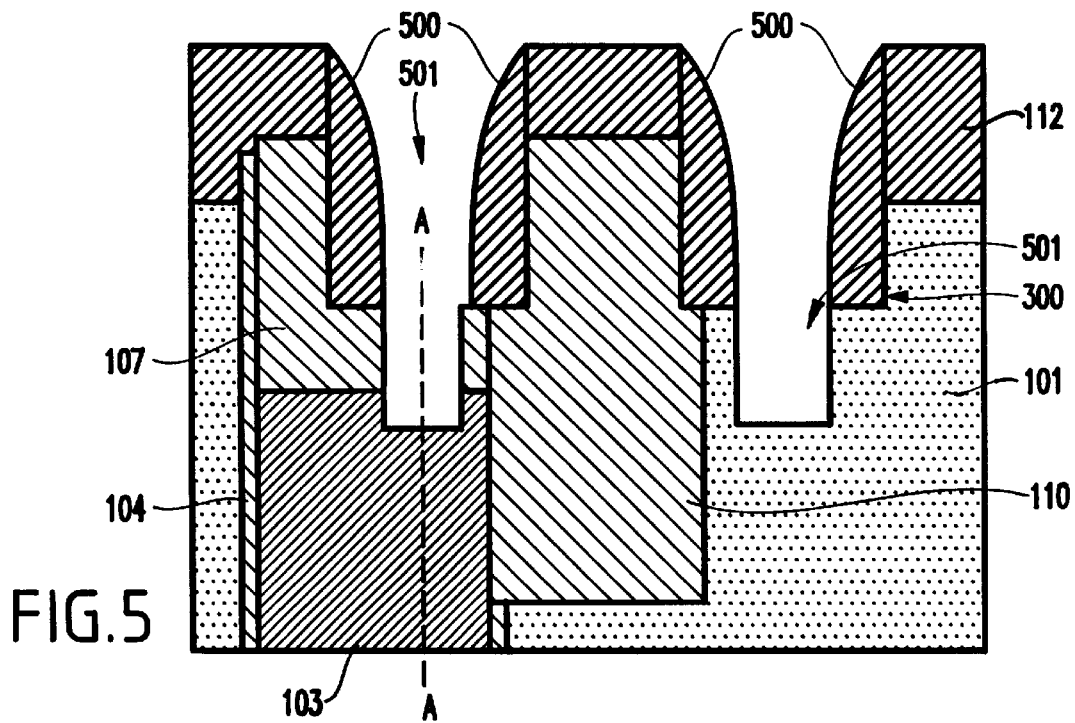
FIG. 5 is a schematic diagram of a partially completed vertical transistor according to the invention
Figure 6:
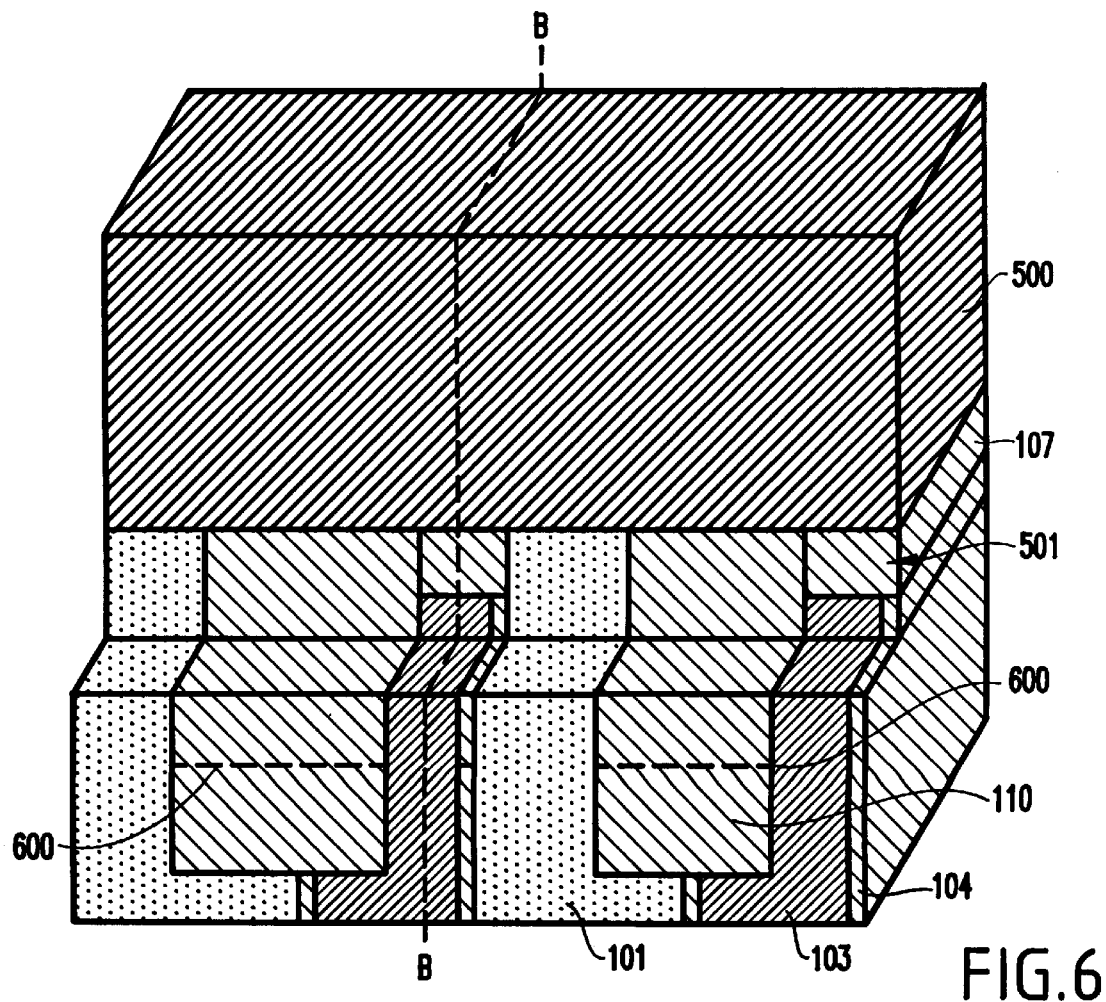
FIG. 6 is a schematic diagram of a partially completed vertical transistor according to the invention.
Figure 7:
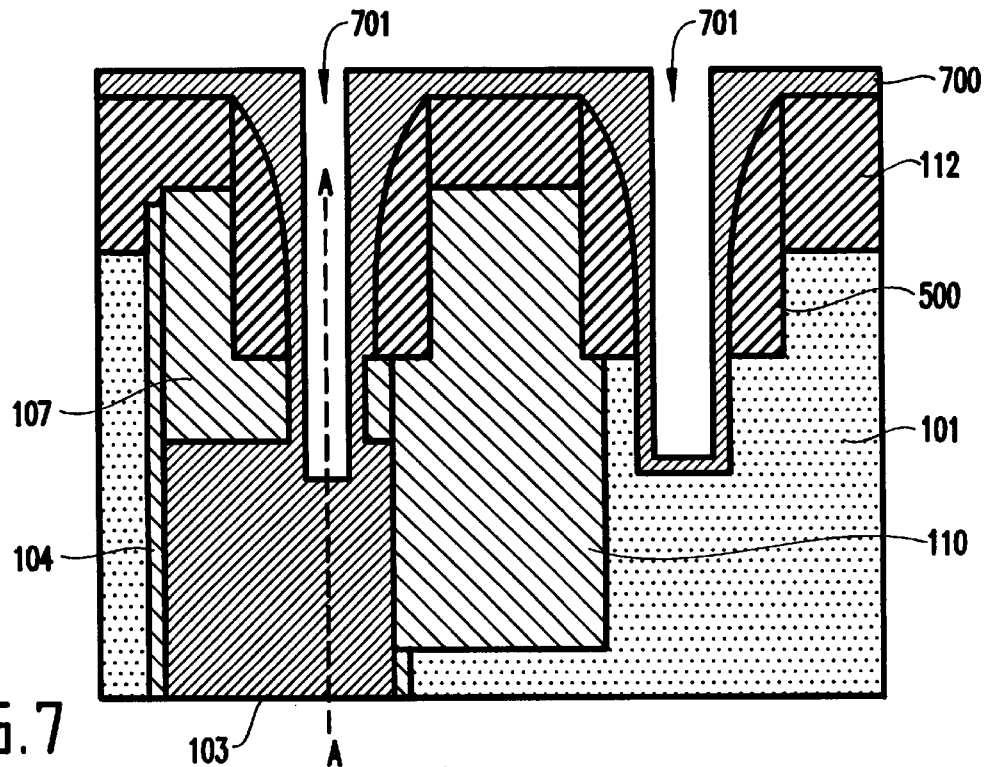
FIG. 7 is a schematic diagram of a partially completed vertical transistor according to the invention.

In a similar manner, FIGS. 5 and 6 illustrate front and side views of the structure. FIG. 5 is a cross-section along line B—B in FIG. 6 and FIG. 6 is a cross-section along line A—A in FIG. 5. Sidewall spacers 500 are formed in the trenches 300 using conventional processing. For example, a silicon nitride or oxynitride layer may be deposited over the structure. The spacer layer 500 would then be etched in, for example, a reactive ion etching (RIE) process to form the spacers 500, shown in FIGS. 5 and 6. The reactive ion etching process etches horizontal surfaces at a substantially faster rate than it etches vertical surfaces, thereby leaving the spacers 500, as shown in the drawings. Further, the reactive ion etching is continued until it overetches the structure to form strap openings 501 that reach to the conductor 103. For example, the etching process can comprise a bromine based etch.

Figure 8:
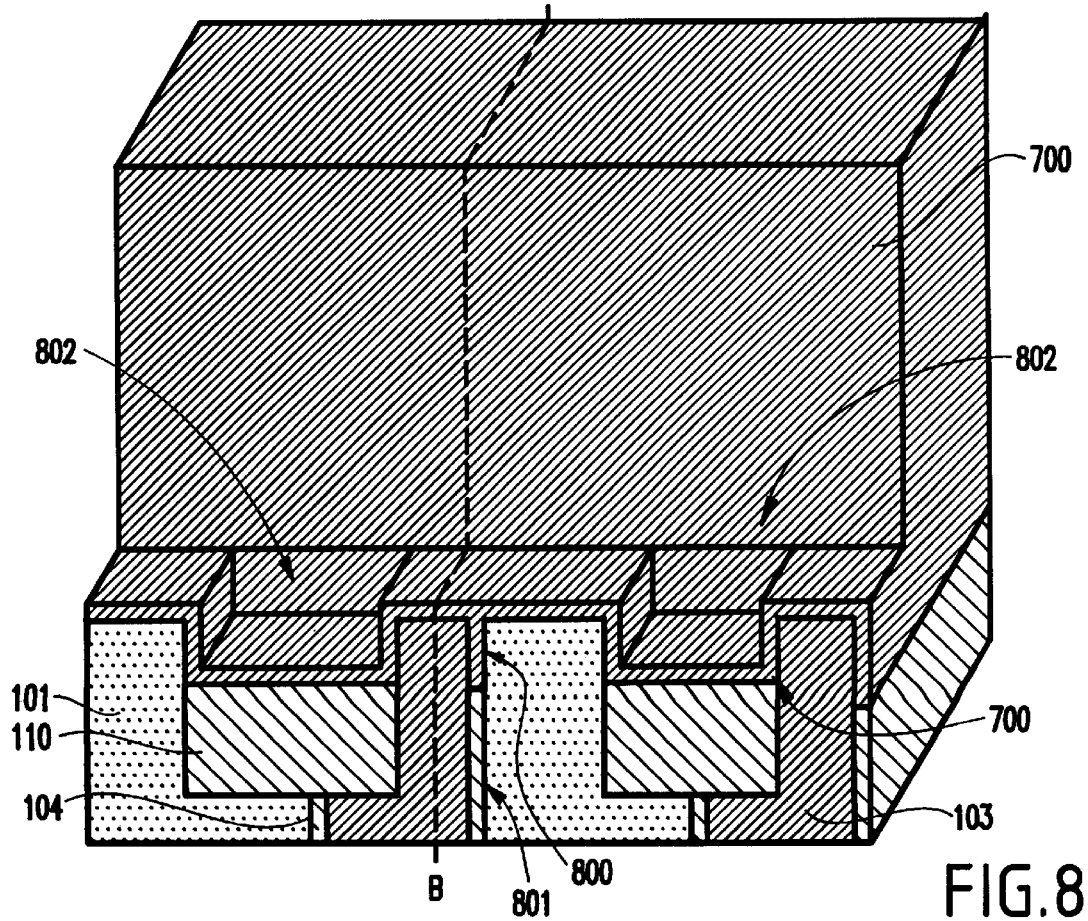
FIG. 8 is a schematic diagram of a partially completed vertical transistor according to the invention.

Then a selective etching process is applied to partially remove the insulator 110 and collar oxide 104. For example, such an etch could comprise a chlorine based etch. However, as would be known by one ordinarily skilled in the art given this disclosure, this etch could be altered to accommodate a different type of insulator material 110, 104. The etch is continued until the collar oxide 104 and insulator 110 are removed to the dotted line 600 shown in FIG. 6. As also shown in FIG. 8, this selective etching process also forms smaller trenches 802 in the larger trench 501. More importantly, this etching process removes an upper portion 800 of the collar oxide 104 and allows a lower portion 801 of the collar oxide 104 to remain. The upper opening 800 in the collar oxide is sometimes referred to herein as a "strap gap" 800.

FIGS. 7 and 8 again are front and side views, respectively and FIG. 7 is a cross-section along line B—B in FIG. 8 and FIG. 8 is a cross-section along line A—A in FIG. 7. A conductor 700 is then deposited in the strap opening 501 such that the conductor 700 makes contact with the conductor 103 and fills the strap gap 800 and forms an isolation opening 701. The conductor 700 used at this stage of the process may, but does not need to be the same conductor (e.g., polysilicon) used for the deep trench conductor 103.

Figure 9:
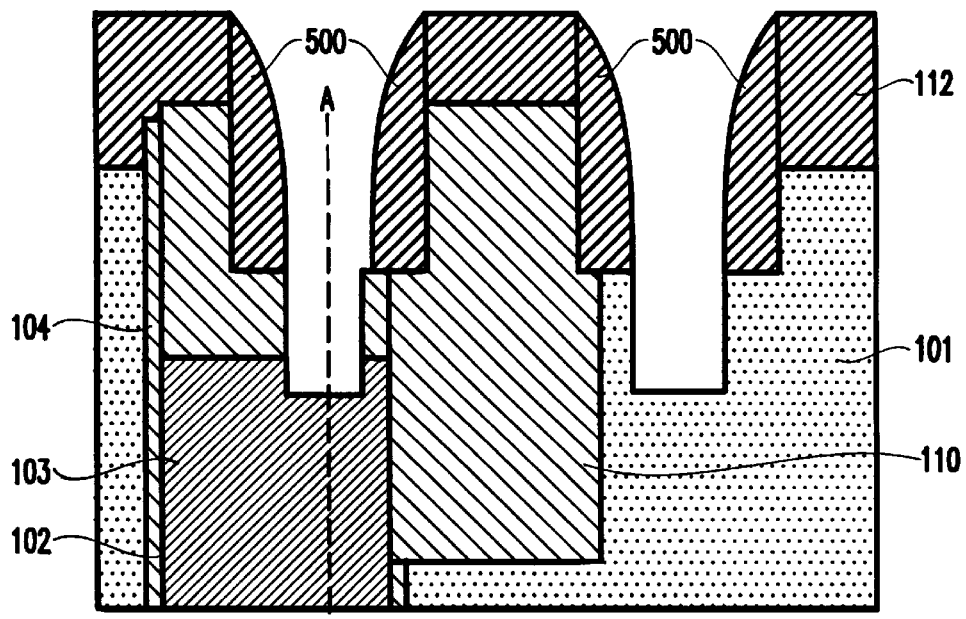
FIG. 9 is a schematic diagram of a partially completed vertical transistor according to the invention.
Figure 10:
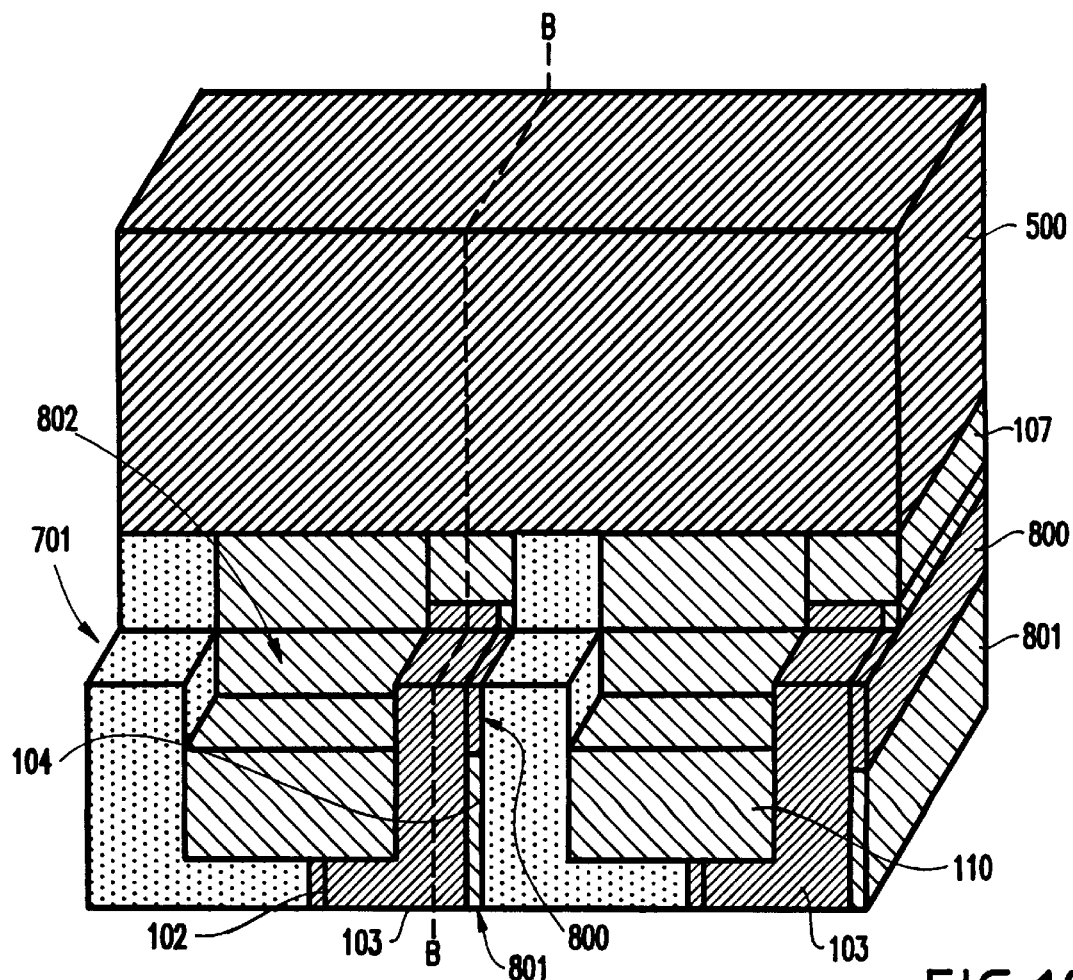
FIG. 10 is a schematic diagram of a partially completed vertical transistor according to the invention.

Once again, FIGS. 9 and 10 are front and side views, respectively and FIG. 9 is a cross-section along line B—B in FIG. 10 and FIG. 10 is a cross-section along line A—A in FIG. 9. The conductor 700 is isotopically etched to remove it from all surfaces except for the strap 800 as shown in FIG. 10. By leaving the area 800 with a conductive material, the buried strap 800 is formed. Therefore, the isotropic etching of the conductor 700 is controlled (e.g., by time, flow rate, etc.) so that only a single thickness of the conductor 700 is removed, thus leaving the relatively deep conductor 800 in the strap gap 700.

Figure 11:
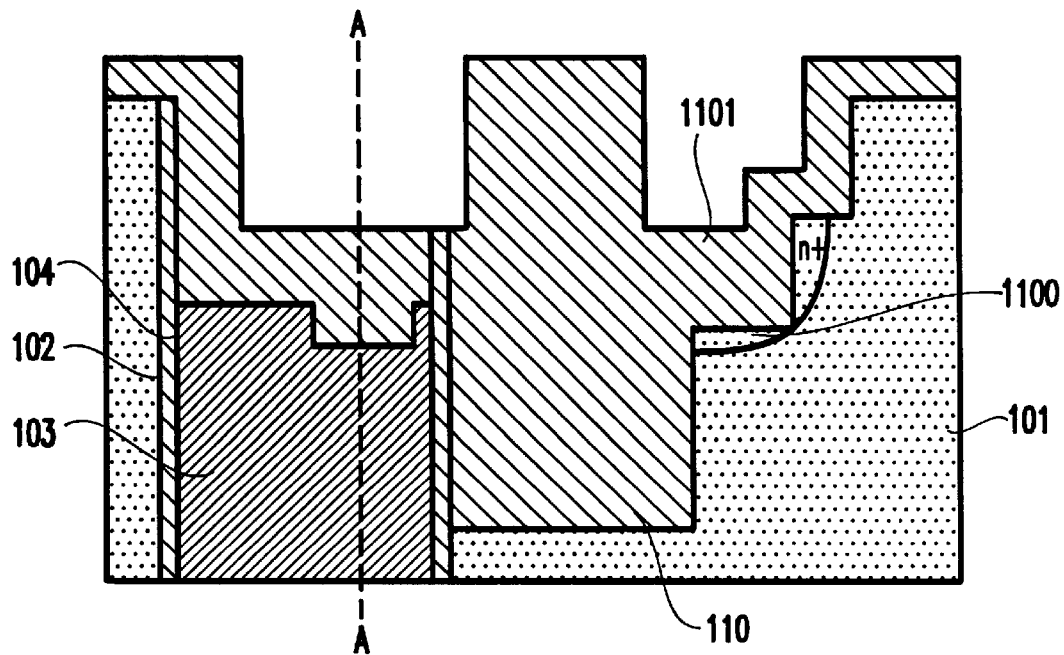
FIG. 11 is a schematic diagram of a partially completed vertical transistor according to the invention.
Figure 12:
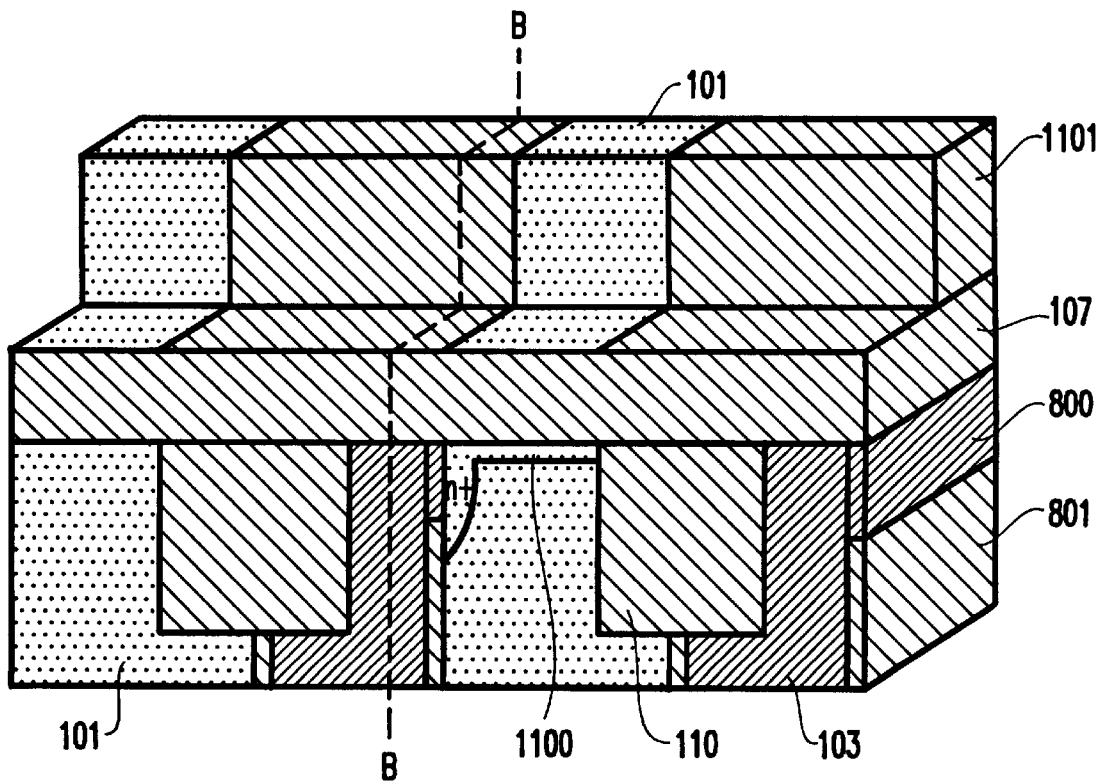
FIG. 12 is a schematic diagram of a partially completed vertical transistor according to the invention.

FIGS. 11 and 12 are again side and front views, respectively, and FIG. 11 is a cross-section along line B—B in FIG. 12 and FIG. 12 is a cross-section along line A—A in FIG. 1. An impurity (such as arsenic, phosphorous etc.) is implanted to dope the polysilicon 101 in the area adjacent to the strap 800 to form a node junction regions 1100. The impurity can be implanted, using for example a masked ion implantation or, the conductor 700 in the strap gap 800 can include the impurity, which diffuses into the substrate when the structure is heated (e.g., to 900° C.). The diffusion region 1100 shown in FIG. 11 is connected adjacent a strap 800 which is below or above the plane of the page, as shown in FIG. 12.

The pad 112 is removed by applying a selective wet or dry etch, such as a hot phosphoric acid, and HF wet etch. Then a sacrificial layer 1101 (e.g., an oxide) is grown on all the exposed silicon 101 surfaces.

Figure 13:
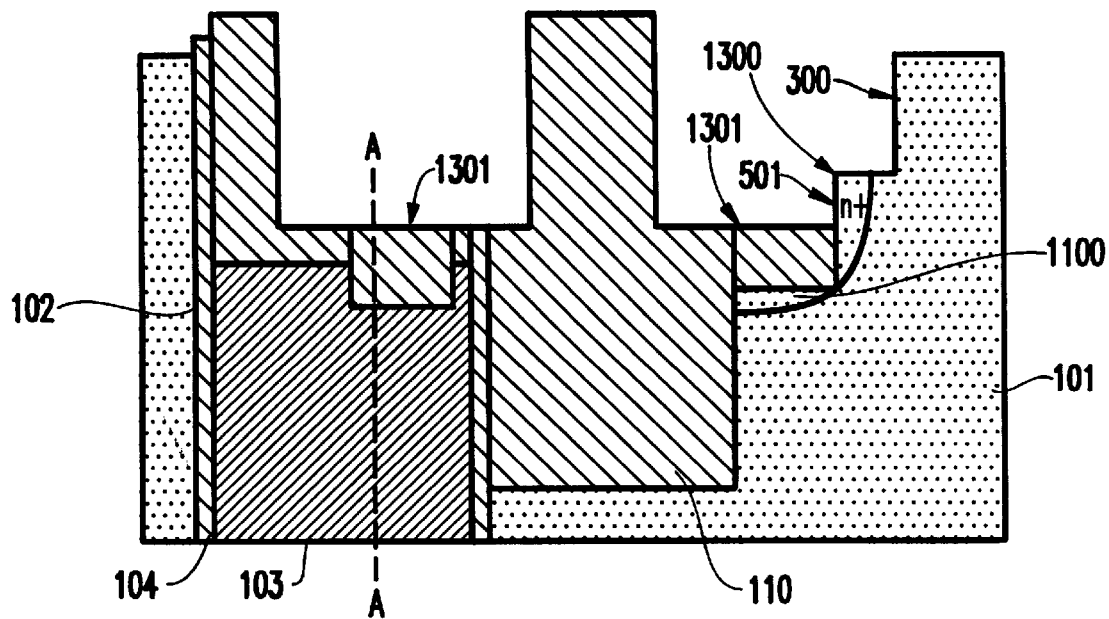
FIG. 13 is a schematic diagram of a partially completed vertical transistor according to the invention.
Figure 14:
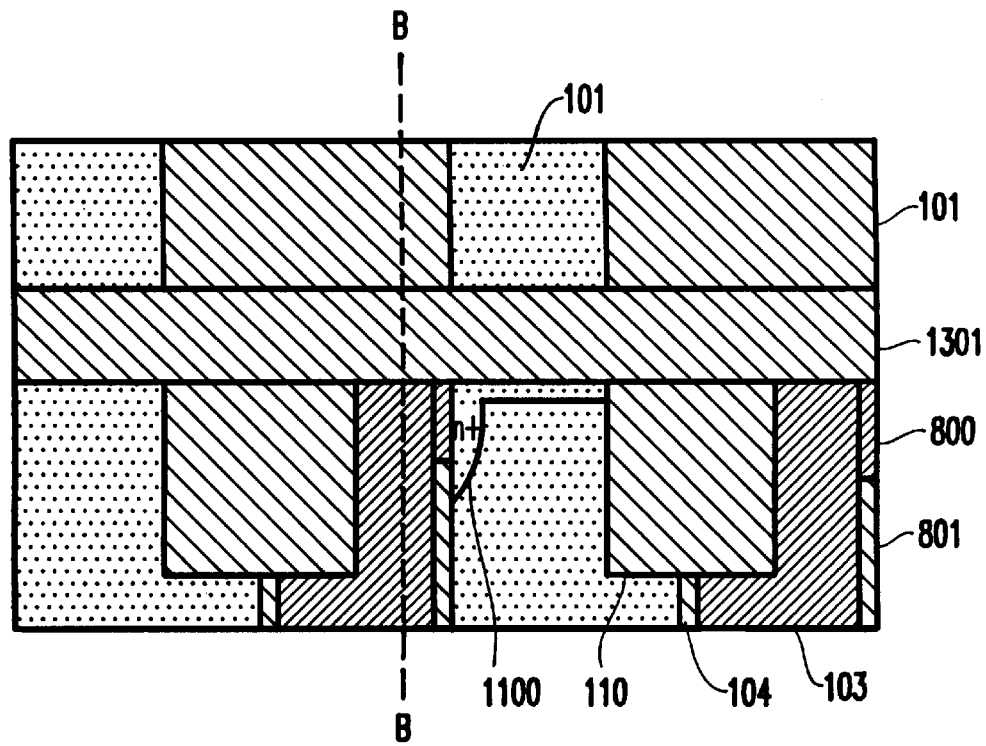
FIG. 14 is a schematic diagram of a partially completed vertical transistor according to the invention

FIGS. 13 and 14, as with the previous illustrations, are front and side views, respectively, and FIG. 13 is a cross-section along line B—B in FIG. 14 and FIG. 14 is a cross-section along line A—A in FIG. 13. An isotopic etch (for example, a wet HF or HCI etch) is applied to the structure to remove enough of the oxide 1101 to reveal the step 1300 formed in the substrate 101 by the different widths of the gate opening 300 and the strap opening 501. The step 1300 will become the P-well region of the vertical transistor and will form the base for the gate conductor. The etch is timed using techniques well known to those ordinarily skilled in the art to limit the removal of the oxide layer 1101 so as to leave the oxide 1101 in the lower region 1301 of the isolation opening 701. This process also leaves the insulator 1301 as an insulating cap over the strap 800.

Figure 15:
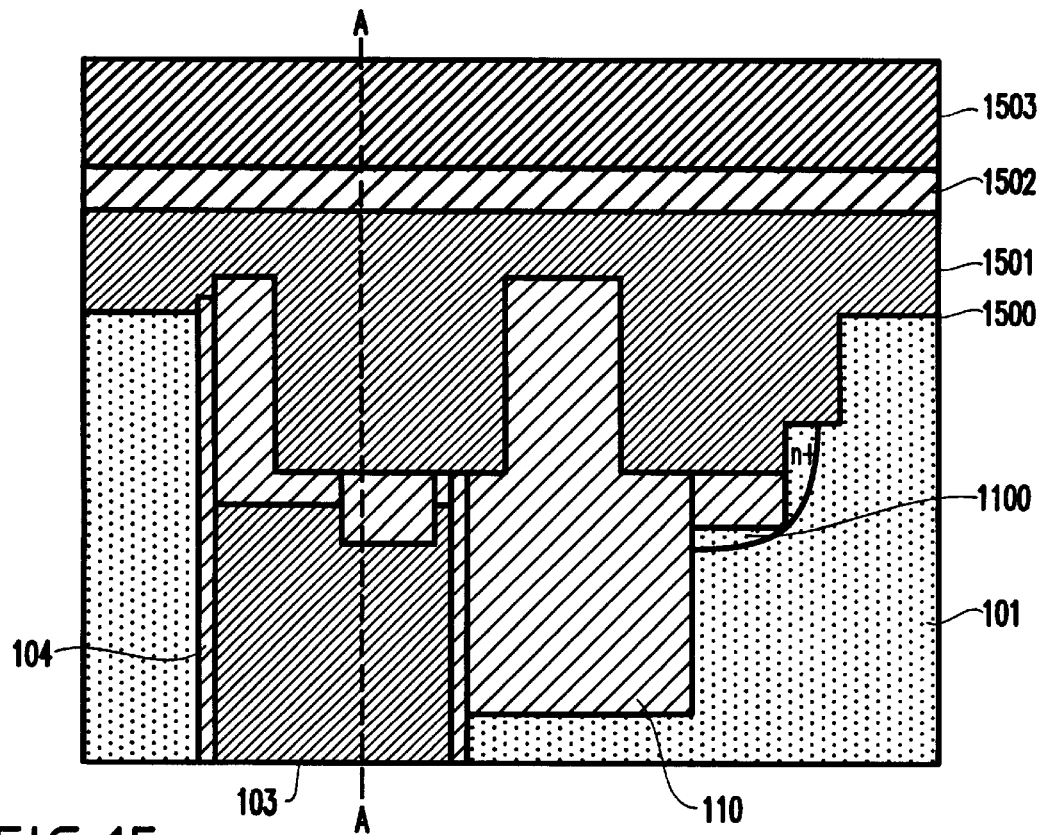
FIG. 15 is a schematic diagram of a partially completed vertical transistor according to the invention.
Figure 16:
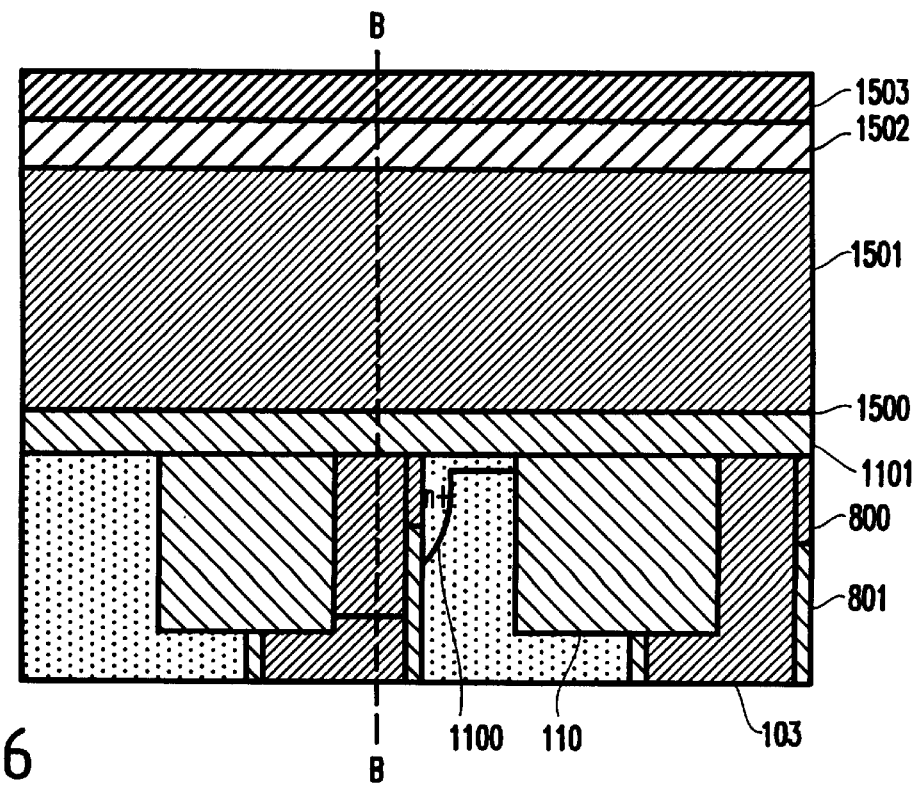
FIG. 16 is a schematic diagram of a partially completed vertical transistor according to the invention.

FIGS. 15 and 16 are also front and side views, respectively, and FIG. 15 is a cross-section along line B—B in FIG. 16 and FIG. 16 is a cross-section along line A—A in FIG. 15. FIGS. 15 and 16 illustrate the formation of a gate insulator (e.g., oxide) layer 1500 which is formed, for example, by conventional oxide growth methods. Then a conductive layer 1501 (e.g., a gate conductor layer), such as metal, alloy or polysilicon is deposited using conventional deposition techniques, such as chemical vapor deposition (CVD), sputtering, evaporation, etc.

The conductive layer 1501 can then be planarized using conventional planarization techniques, such as chemical mechanical polishing (CMP). Next, another conductive layer (e.g., tungsten silicide) 1502 may be formed over the conductive layer 1501 (e.g., to reduce the resistance of the conductive layer 1501). Finally, the structure is capped with an insulator, such as silicon nitride 1503.

Figure 17:
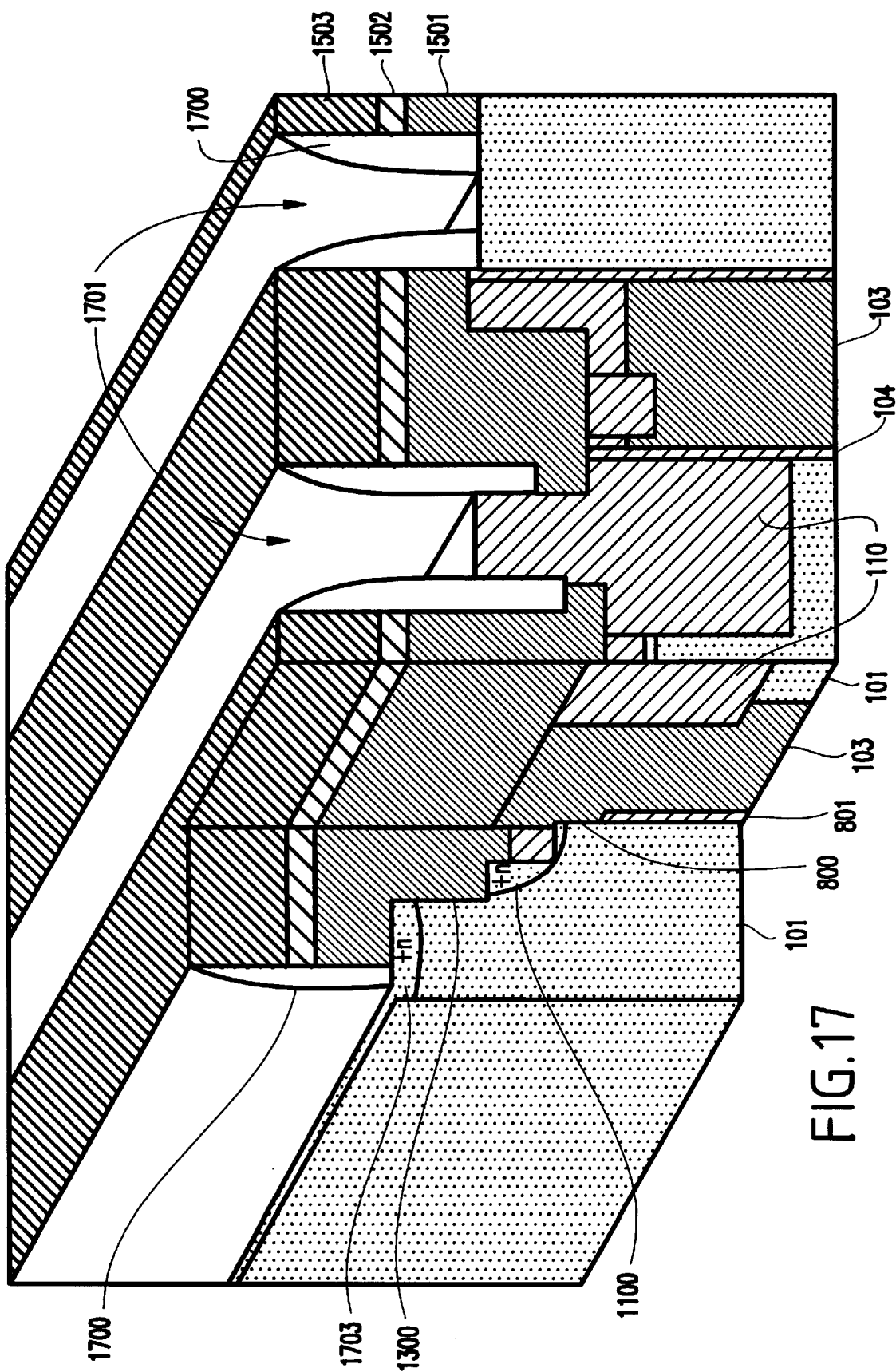
FIG. 17 is a schematic diagram of a completed vertical transistor according to the invention.

As shown in FIG. 17 gate conductor openings 1701 are formed, using conventional lithographic masking and etching techniques. An impurity, such as those discussed above, is implanted in the gate conductor openings 1701 to form second diffusion regions 1703. Sidewall spacers 1700 are formed along the gate sidewalls of the gate conductor openings 1701 using the same or similar processes used to form the sidewall spacers, discussed above. The gate conductors are deposited and an insulator such as an oxide or other similar insulator is then deposited over the structure and contact holes and bitlines are formed as known in the art.

Figure 18:
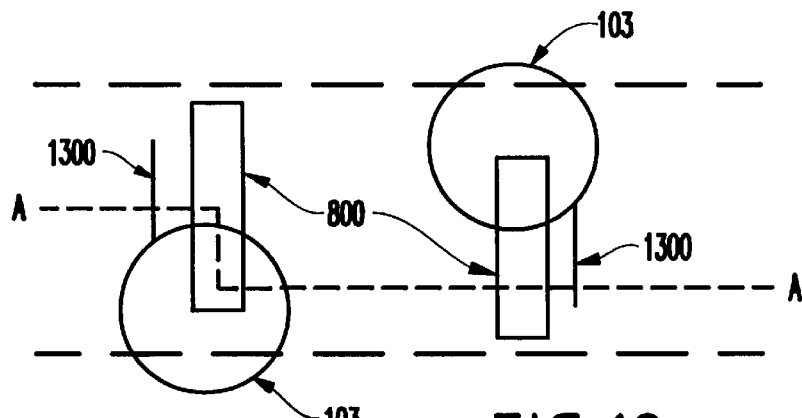
FIG. 18 is a schematic diagram of a partially completed vertical transistor according to the invention.

FIG. 18 is a top view of the structure and illustrates the relative position of the deep storage trenches 103, the straps 800 and the walls of the vertical transistors 1300, and the line A—A upon which the perspective drawing in FIG. 17 is cut. As shown in FIG. 18, the conductive strap 800 laterally extends from the vertical storage capacitor 103. Also, the channel region 1300 extendes along a vertical surface that lies outside of and is laterally displaced from the vertical storage capacitor 103.

In operation, a voltage in one of the gate conductor stack causes the P-well in the substrate 101 next to the step 1300 to become conductive, forming a connection between the two diffusion regions 1100, 1703 (e.g., the source and drain). This process forms an electrical connection between the contact bitline and the storage device 103, through the strap 800 by way of the vertical transistor along the strap 1300.

Figure 19:
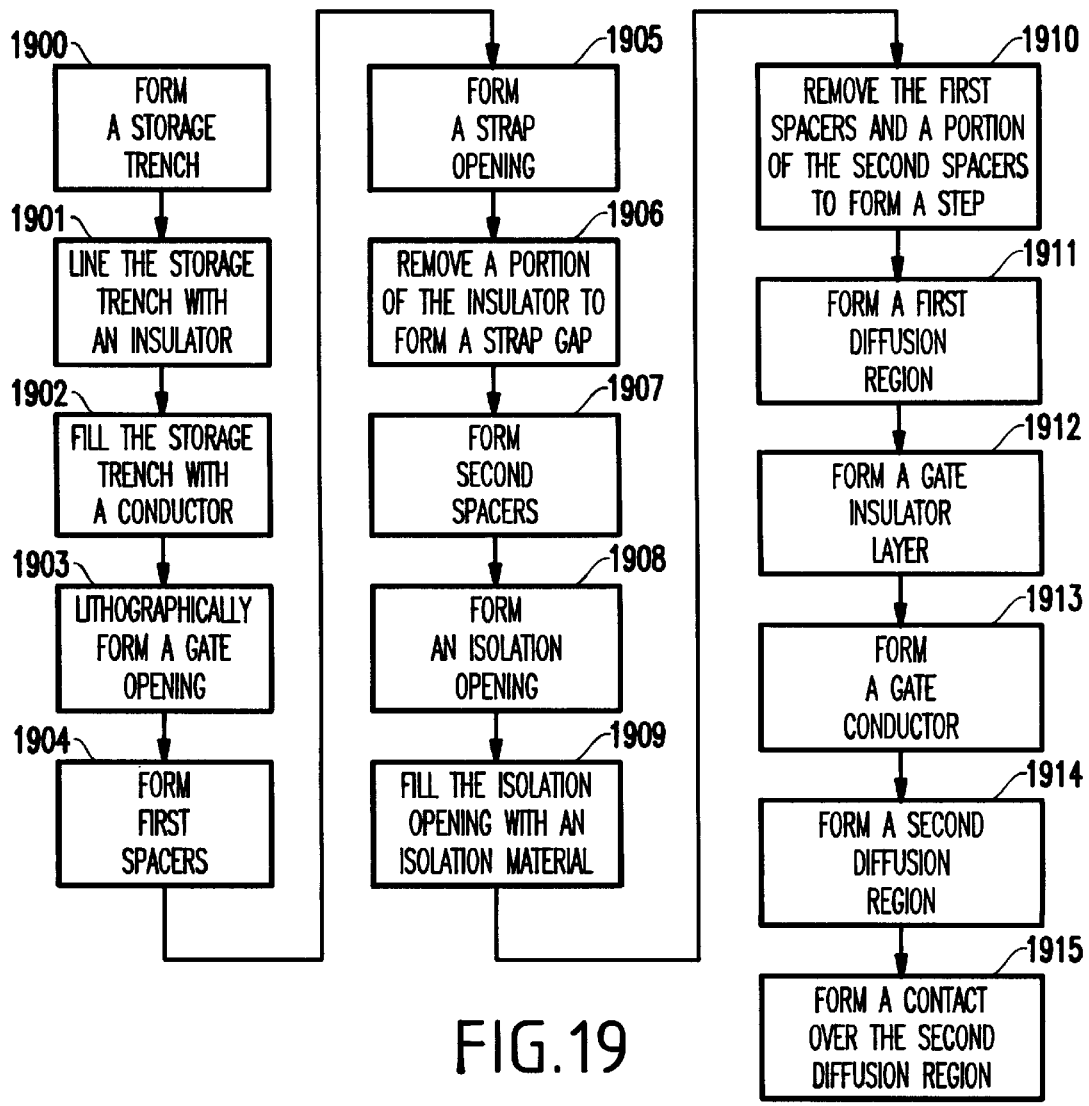
FIG. 19 is a flow diagram illustrating a preferred method of the invention.

FIG. 19 is a flowchart of an embodiment of the invention. More specifically, in item 1900 the storage trench 102 is formed. In item 1901 the storage trench 102 is lined with the node dielectric and insulator 104 and the storage trench 102 is filled with the conductor 103 as shown in item 1902. In item 1903 the gate opening 300 is lithographically formed. In item 1904 the first spacers 500 are formed and the strap opening 501 is formed as shown in item 1905. A portion of the insulator 104 is removed to form the strap gap 800 in item 1906. The second spacers 700 are formed in item 1907 and the isolation opening 701 is formed in item 1908. The isolation opening 701 is filled with the isolation material 1101 in item 1909. In item 1910 the first spacers 500 and a portion of the second spacers 700 are removed to form the step 1300. In item 1911 the first diffusion region 1100 is formed and the gate insulator layer 1500 is formed as shown in item 1912. The gate conductor 1501 is formed as shown in item 1913. The second diffusion region 1703 is formed in item 1914. In item 1915 the contact over the second diffusion region 1703 is formed.

As discussed above, the invention forms the strap 800 for the vertical transistor in a self-aligned manner which avoids the problems associated with conventional lithographic techniques (e.g., only the gate opening 300 is formed with lithographic techniques, the step 1300 and strap gap 800 are formed using self-aligned spacer technology). By reducing the amount of lithographic processing, the invention avoids problems commonly associated with lithographic processing, including size reduction problems, alignment inaccuracies, etc. Further, with the invention by forming the step 1300 in such a self-aligned manner, the spacing between the diffusion regions 1100, 1703 and the vertical transistor portion 1300 is very precise. This allows the device to be made smaller (which makes the device less expensive and faster) and reduces the number of defects which results in an overall superior product when compared to conventional structures.

While the invention has been described in terms of preferred embodiments, those skilled in the art will recognize that the invention can be practiced with modification within the spirit and scope of the appended claims.

What is claimed is:

1. A method of manufacturing an integrated circuit chip, comprising:

forming a storage capacitor in a vertical opening in a horizontal substrate;

forming a conductive strap laterally extending from said vertical opening; and forming a transistor having a channel region extending along a vertical surface, said vertical surface lying outside of and being laterally displaced from said vertical opening, said transistor being electrically connected to said storage capacitor by an outdiffusion of said conductive strap.

2. The method in claim 1, wherein said forming of said conductive strap includes:

removing an upper portion of an insulator surrounding said storage capacitor to form a strap gap; and filling said strap gap with a conductive material.

3. The method in claim 1, wherein said forming of said transistor comprises lithographically forming a gate opening in said substrate over said storage capacitor, said gate opening having at least one wall laterally displaced from said vertical opening, wherein said wall of said gate opening comprises said vertical surface.

4. The method in claim 3, further comprising:

forming first spacers in said gate opening; and forming a strap opening in said substrate using said first spacers to align said strap opening, wherein said conductive strap is formed by forming second spacers in said strap opening.

5. The method in claim 4, further comprising removing said first spacers and a portion of said second spacers to form a step, said outdiffusion being formed in a portion of said step adjacent said conductive strap.

6. The method in claim 5, wherein said gate opening is wider than said strap opening, thereby forming said step.

7. The method in claim 1, further comprising forming a gate conductor adjacent said vertical surface, wherein a voltage in said gate conductor makes said channel region conductive, electrically connecting said transistor and said storage capacitor via said conductive strap and said outdiffusion.

8. A method of manufacturing an integrated circuit chip, comprising:

forming a storage capacitor in a vertical opening in a horizontal substrate;

forming a step in said vertical opening above said storage capacitor;

forming a conductive strap along a lower portion of said step, said conductive strap being electrically connected to said storage capacitor and laterally extending from said vertical opening; and forming a transistor having a channel region extending along a vertical portion of said step, said vertical surface lying outside of and being laterally displaced from said vertical opening, said transistor being electrically connected to said storage capacitor by an outdiffusion of said conductive strap.

9. The method in claim 8, wherein said forming of said conductive strap includes:

removing an upper portion of an insulator surrounding said storage capacitor to form a strap gap; and filling said strap gap with a conductive material.

10. The method in claim 8, wherein said forming of said transistor comprises lithographically forming a gate opening in said substrate over said storage capacitor, said gate opening having at least one wall laterally displaced from said vertical opening, wherein said wall of said gate opening comprises said vertical surface.

11. The method in claim 10, further comprising:

forming first spacers in said gate opening; and forming a strap opening in said substrate using said first spacers to align said strap opening, wherein said conductive strap is formed by forming second spacers in said strap opening.

12. The method in claim 11, further comprising removing said first spacers and a portion of said second spacers to form said step, said outdiffusion being formed in a portion of said step adjacent said second spacers.

13. The method in claim 12, wherein said gate opening is wider than said strap opening, thereby forming said step.

14. The method in claim 8, further comprising forming a gate conductor adjacent said vertical surface, wherein a voltage in said gate conductor makes said channel region conductive, electrically connecting said transistor and said storage capacitor via said conductive strap and said outdiffusion.

15. An integrated circuit chip, comprising:

a storage capacitor located in a vertical opening in a horizontal substrate;

a transistor having a channel region extending along a vertical surface, said vertical surface lying outside of and being laterally displaced from said vertical opening; and a conductive strap laterally extending from said vertical opening, said conductive strap having an outdiffusion electrically connecting said transistor to said storage capacitor.

16. The integrated circuit chip in claim 15, further comprising:

an insulator surrounding said storage capacitor; and a strap gap in an upper portion of said insulator, said conductive strap being located in said strap gap.

17. The integrated circuit chip in claim 15, wherein said vertical transistor comprises a gate opening in said substrate over said storage capacitor, said gate opening having at least one wall laterally displaced from said vertical opening, wherein said wall of said gate opening comprises said vertical surface.

18. The integrated circuit chip in claim 17, further comprising:

a strap opening in said substrate aligned with first spacers in said gate opening; and second spacers in said strap opening, wherein a portion of said second spacers comprise said conductive strap.

19. The integrated circuit chip in claim 18, further comprising a step formed by a width difference in said gate opening and said strap opening, said outdiffusion being located in a portion of said step adjacent said conductive strap.

20. The integrated circuit chip in claim 15, further comprising a gate conductor adjacent said vertical surface, wherein a voltage in said gate conductor makes said channel region conductive, electrically connecting said transistor and said storage capacitor via said conductive strap and said outdiffusion.

* * * * *